(12) United States Patent
Kim (10) Patent No.: US 11,538,517 B2
(45) Date of Patent: Dec. 27, 2022

(54) SENSE AMPLIFYING CIRCUIT OF SEMICONDUCTOR MEMORY DEVICE FOR OFFSET CANCELLATION OPERATION

(71) Applicant: SK hynix Inc., Gyeonggi-do (KR)

(72) Inventor: Suk Min Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/227,741

(22) Filed: Apr. 12, 2021

(65) Prior Publication Data

US 2022/0157369 A1 May 19, 2022

(30) Foreign Application Priority Data

Nov. 17, 2020 (KR) .......................... 10-2020-0153667

(51) Int. Cl.
*G11C 7/12* (2006.01)
*G11C 11/4091* (2006.01)
*G11C 11/4094* (2006.01)
*G11C 11/4096* (2006.01)
*G11C 11/4093* (2006.01)
*G11C 7/06* (2006.01)

(52) U.S. Cl.
CPC .......... *G11C 11/4091* (2013.01); *G11C 7/065* (2013.01); *G11C 7/12* (2013.01); *G11C 11/4093* (2013.01); *G11C 11/4094* (2013.01); *G11C 11/4096* (2013.01); *G11C 2207/002* (2013.01)

(58) Field of Classification Search
CPC .......................... G11C 11/4091; G11C 11/4092
See application file for complete search history.

(56) References Cited

U.S. PATENT DOCUMENTS

| 2012/0188836 | A1* | 7/2012 | Lee ...................... G11C 11/4091 365/207 |
| 2017/0069368 | A1* | 3/2017 | Woo .................... G11C 11/4094 |
| 2018/0182449 | A1* | 6/2018 | Kim ........................ G11C 7/02 |
| 2019/0007000 | A1* | 1/2019 | Jeong ..................... H03F 1/301 |
| 2019/0096446 | A1* | 3/2019 | Lee ......................... G11C 7/062 |
| 2020/0075065 | A1* | 3/2020 | Jeong ..................... G11C 7/065 |

FOREIGN PATENT DOCUMENTS

| KR | 10-2017-0030304 | 3/2017 |
| KR | 10-2020-0024555 | 3/2020 |

OTHER PUBLICATIONS

Kim et al., Sensing Margin Enhancement Technique Utilizing Boosted Reference Voltage for Low-Voltage and High-Density DRAM, IEEE Transactions on Very Large Scale Integration (VLSI) Systems, Oct. 2019, p. 2413-p. 2422, vol. 27, IEEE.

* cited by examiner

Primary Examiner — Mushfique Siddique
(74) Attorney, Agent, or Firm — IP & T Group LLP (57) ABSTRACT

According to an embodiment of the present disclosure, a semiconductor memory device includes a bit line sense amplifier coupled between a pull-up voltage line and a pull-down voltage line, and suitable for sensing a voltage difference between first and second bit lines by sequentially performing a precharge operation, an offset cancellation operation, a charge sharing operation, and an amplification operation, wherein the bit line sense amplifier pre-biases a voltage level of the second bit line depending on a voltage level of the first bit line during the charge sharing operation; and a driving circuit suitable for supplying operating voltages to the pull-up voltage line and the pull-down voltage line during the offset cancellation operation, the charge sharing operation, and the amplification operation.

18 Claims, 10 Drawing Sheets

SENSE AMPLIFYING CIRCUIT OF SEMICONDUCTOR MEMORY DEVICE FOR OFFSET CANCELLATION OPERATION

CROSS-REFERENCE TO RELATED APPLICATION

The present application claims priority of Korean Patent Application No. 10-2020-0153667, filed on Nov. 17, 2020, which is herein incorporated by reference in its entirety.

BACKGROUND

1. Field

The present disclosure relates to semiconductor design technology, and specifically to, a bit line sense amplifier of a semiconductor memory device.

2. Description of the Related Art

A dynamic random access memory (DRAM), from among semiconductor memory devices, is operated by using a method of writing data by using electric charges stored in a cell capacitor in a memory cell. Memory cells are connected between a bit line (BL) and a complementary bit line (BLB). In the DRAM, if a read operation or a refresh operation is performed, a sense amplifier senses and amplifies a voltage difference between the bit line BL and the complementary bit line BLB. Semiconductor elements constituting the sense amplifier may have different characteristics, for example threshold voltages, from each other due to process, voltage, or temperature variation (PVT), or the like. Accordingly, offset noise of the sense amplifier may be caused. The offset noise may reduce an effective sensing margin of the sense amplifier, and performance of a DRAM may deteriorate.

SUMMARY

Various embodiments of the present disclosure are directed to a sense amplifying circuit for performing an offset cancellation operation, the sense amplifying circuit capable of maximizing a voltage difference between a bit line and a reference bit line by pre-biasing a voltage level of the reference bit line depending on a data value of the bit line and a semiconductor memory device including the sense amplifying circuit.

According to an embodiment of the present disclosure, a semiconductor memory device includes a bit line sense amplifier coupled between a pull-up voltage line and a pull-down voltage line, and suitable for sensing a voltage difference between first and second bit lines by sequentially performing a precharge operation, an offset cancellation operation, a charge sharing operation, and an amplification operation, wherein the bit line sense amplifier pre-biases a voltage level of the second bit line depending on a voltage level of the first bit line during the charge sharing operation; and a driving circuit suitable for supplying operating voltages to the pull-up voltage line and the pull-down voltage line during the offset cancellation operation, the charge sharing operation, and the amplification operation.

According to an embodiment of the present disclosure, a sense amplifying circuit includes a first inverter having an input terminal coupled to a first bit line and an output terminal coupled to a second inner bit line; a second inverter having an input terminal coupled to a second bit line and an output terminal coupled to a first inner bit line; a first offset cancellation switch suitable for electrically coupling the first inner bit line to the second bit line during an offset cancellation operation; a second offset cancellation switch suitable for electrically coupling the second inner bit line to the first bit line during the offset cancellation operation; a first isolation switch suitable for electrically coupling the first inner bit line to the first bit line during an amplification operation; and a second isolation switch suitable for electrically coupling the second inner bit line to the second bit line during a charge sharing operation and the amplification operation.

According to an embodiment of the present disclosure, a sense amplifying circuit includes a pull-up circuit including first and second pull-up transistors respectively coupled between a pull-up voltage line and first and second inner bit lines, the first and second pull-up transistors having a cross-coupled structure; a pull-down circuit including first and second pull-down transistors respectively coupled between a pull-down voltage line and the first and second inner bit lines; a first offset cancellation switch suitable for electrically coupling the first inner bit line to a second bit line during an offset cancellation operation; a second offset cancellation switch suitable for electrically coupling the second inner bit line to a first bit line during the offset cancellation operation; a first isolation switch suitable for electrically coupling the first inner bit line to the first bit line during an amplification operation; a second isolation switch suitable for electrically coupling the second inner bit line to the second bit line during the amplification operation; a first pre-biasing switch suitable for electrically coupling a gate of the second pull-down transistor to the first bit line during the offset cancellation operation, a charge sharing operation and the amplification operation; and a second pre-biasing switch suitable for electrically coupling a gate of the first pull-down transistor to the second bit line during the offset cancellation operation and the amplification operation.

According to an embodiment of the present disclosure, an operating method of a semiconductor memory device includes a precharge operation of precharging target and reference bit lines to a precharge level; a charge sharing operation of making the target bit line share a charge stored in a target memory cell for the target bit line to have a voltage level different from the reference bit line; a pre-biasing operation of adjusting the voltage level of the reference bit line to an inverted voltage level of the target bit line; and an amplification operation of amplifying a voltage difference between the target and reference bit lines.

According to embodiments of the present disclosure, the sense amplifying circuit may compensate for the offset by an offset cancellation operation, and maximize a voltage difference between a bit line and a reference bit line by pre-biasing a voltage level of the reference bit line depending on a data value of the bit line. Thus, by maximizing the potential difference in the bit line pair, the effective sensing margin can be improved, which has the effect of improving the performance of the memory device.

DETAILED DESCRIPTION

Various embodiments of the present disclosure are described below with reference to the accompanying drawings. The embodiments may, however, be embodied in different forms and thus should not be construed as limited to the embodiments set forth herein. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Figure 1:
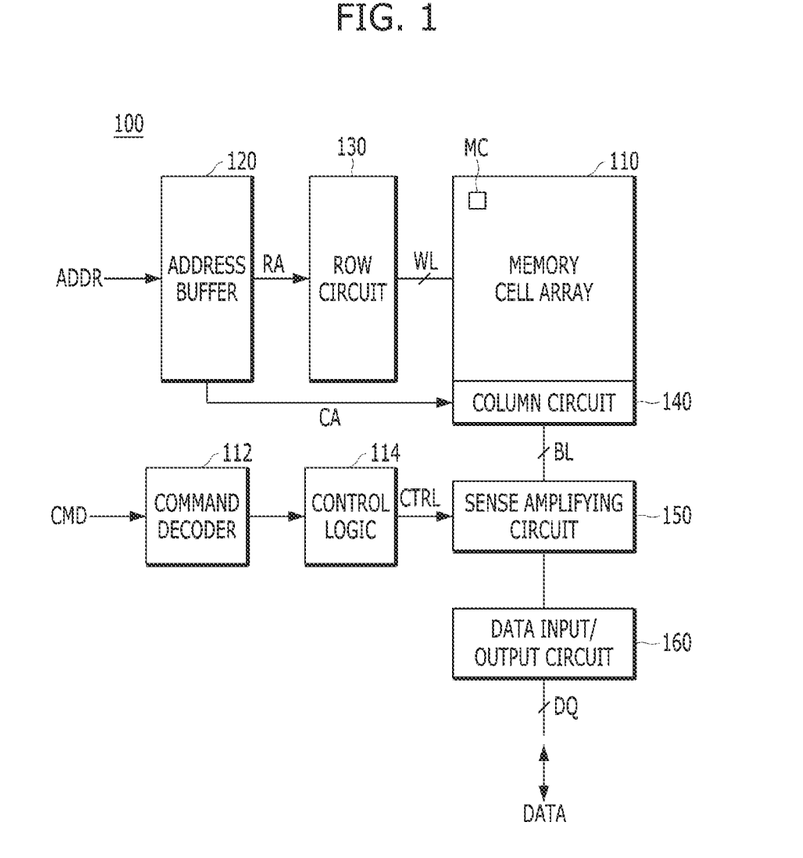
FIG. 1 is a block diagram illustrating a semiconductor memory device in accordance with an embodiment of the present invention.

FIG. 1 is a block diagram illustrating a semiconductor memory device 100 in accordance with an embodiment of the present invention.

Referring to FIG. 1, the memory device 100 may be a storage apparatus that is based on a semiconductor device. For example, the memory device 100 may be a dynamic random access memory (DRAM), a synchronous DRAM (SDRAM), a double data rate SDRAM (DDR SDRAM), a low-power DDR SDRAM (LPDDR SDRAM), a graphic DDR SDRAM (GDDR SDRAM), a DDR2 SDRAM, a DDR3 SDRAM, or a DDR4 SDRAM, or a resistive memory such as phase change random access memory (PRAM), magnetic random access memory (MRAM), resistive random access memory (RRAM), or the like.

The memory device 100 may output data through data lines DQ in response to a command CMD, an address ADDR, and control signals received from an external device, for example, a memory controller (not shown). The memory device 100 may include a memory cell array 110, a command decoder 112, a control logic 114, an address buffer 120, a row circuit 130, a column circuit 140, a sense amplifying circuit 150, and a data input/output circuit 160.

The memory cell array 110 may include a plurality of memory cells MC which are arranged in rows and columns in the form of a matrix. The memory cell array 110 may include a plurality of word lines WL and a plurality of bit lines BL which are connected to the plurality of memory cells MC. The plurality of word lines WL may be connected to rows of the plurality of memory cells and the plurality of bit lines BL may be connected to columns of the plurality of memory cells MC.

The command decoder 112 may generate an internal command, such as an active command, a read command, a write command, and a precharge command, or the like, by decoding the command CMD which is received from the memory controller.

The control logic 114 may generate control signals for controlling the overall operations of the memory device 100 based on the internal command, such as the active command, the read command, the write command, and the precharge command, or the like, which is provided from the command decoder 112. Though FIG. 1 shows that the control logic provides a sensing control signal CTRL for controlling an operation of the sense amplifying circuit 150, the embodiments are not limited thereto. The control signals may be provided to the command decoder 112, the control logic 114, the address buffer 120, the row circuit 130, the column circuit 140, the sense amplifying circuit 150, and the data input/output circuit 160, for controlling the operations thereof.

The address buffer 120 may receive the address ADDR from the memory controller, and buffer the address ADDR. The address ADDR may include a row address RA for designating rows of the memory cell array 110, and a column address CA for designating columns of the memory cell array 110. The address buffer 120 may transmit the row address RA to the row circuit 130, and the column address CA to the column circuit 140.

The row circuit 130 may select at least one among the plurality of word lines WL of the memory cell array 110. The row circuit 130 may decode the row address RA received from the address buffer 120, select at least one word line corresponding to the row address RA, and activate the selected word line.

The column circuit 140 may select at least one bit line among the plurality of bit lines BL of the memory cell array 110. The column circuit 140 may decode the column address CA received from the address buffer 120, and select at least one bit line corresponding to the column address CA.

The sense amplifying circuit 150 may be connected to the plurality of bit lines BL of the memory cell array 110. The sense amplifying circuit 150 may perform an offset cancellation operation according to the sensing control signal CTRL provided from the control logic 114, and sense a change in a voltage in a bit line selected among the plurality of bit lines BL, and then, amplifies and outputs the change in the voltage.

The data input/output circuit 160 may output data, which is output based on the change in the voltage sensed and amplified by the sense amplifying circuit 150, to the outside via the data lines DQ.

Figure 2:
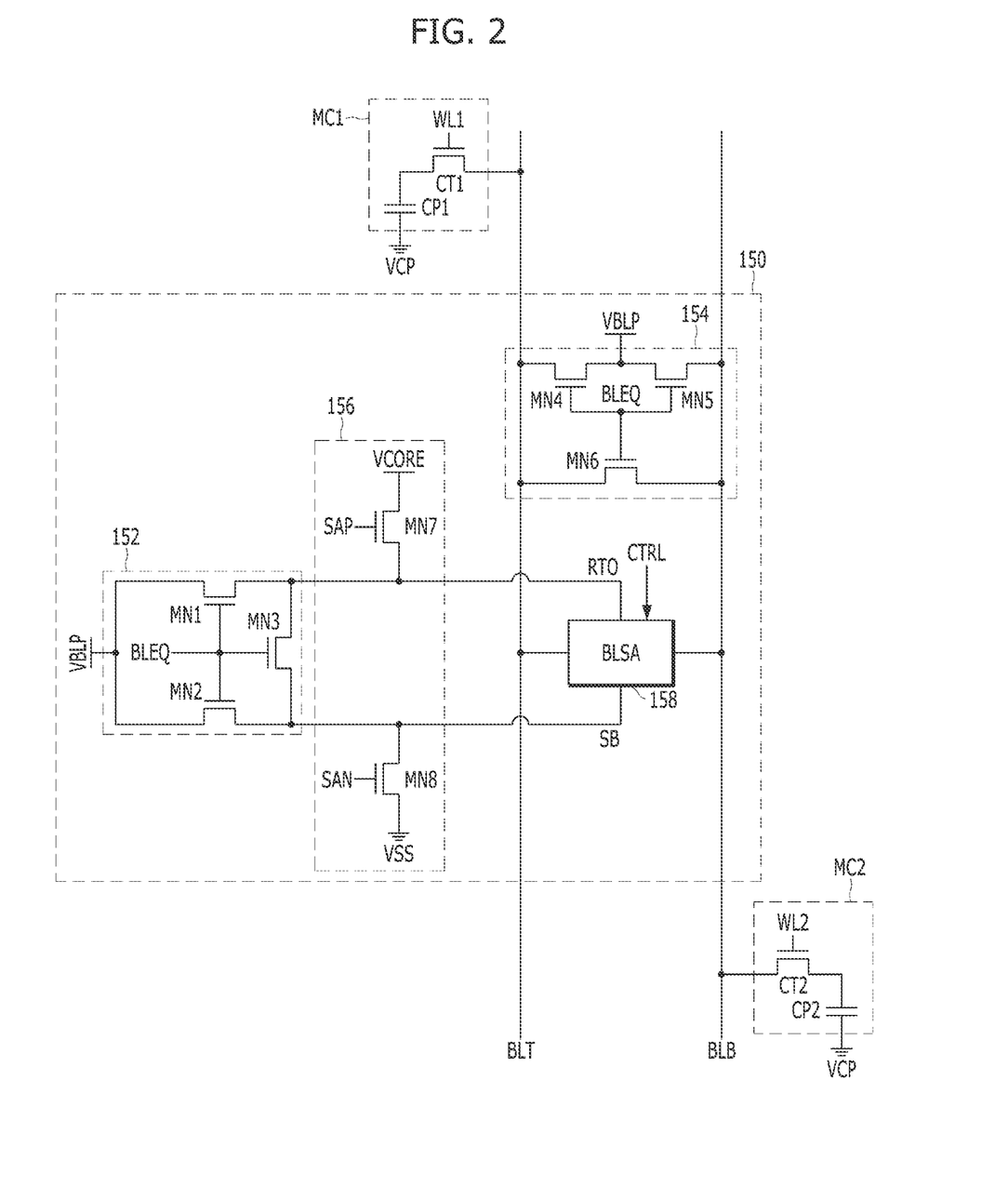
FIG. 2 is a circuit diagram illustrating a sense amplifying circuit of FIG. 1 in accordance with an embodiment of the present invention.

FIG. 2 is a circuit diagram illustrating the sense amplifying circuit 150 of FIG. 1 in accordance with an embodiment of the present invention.

Referring to FIG. 2, the sense amplifying circuit 150 for sensing a change in a voltage between a first bit line BLT and a second bit line BLB respectively coupled to a first memory cell MC1 and a second memory cell MC2 included in the memory cell array 110, is shown.

The first memory cell MC1 may be coupled between a first word line WL1 and the first bit line BLT, and include a cell transistor CT1 and a cell capacitor CP1. The cell capacitor CP1 may be coupled between a cell plate voltage (VCP) terminal and the cell transistor CT1, and the cell transistor CT1 may be coupled between the cell capacitor CP1 and the first bit line BLT, and have a gate receiving a signal at the first word line WL1. Likewise, the second memory cell MC2 may be coupled between a second word line WL2 and the second bit line BLB, and include a cell transistor CT2 and a cell capacitor CP2. The cell capacitor CP2 may be coupled between the cell plate voltage (VCP) terminal and the cell transistor CT2, and the cell transistor CT2 may be coupled between the cell capacitor CP2 and the second bit line BLB, and have a gate receiving a signal at the second word line WL2. For reference, when the first word line WL1 is activated, the first bit line BLT coupled to the cell transistor CT1 to be turned on becomes a target bit line from which an output data is outputted, and the second bit line BLB becomes a reference bit line. Moreover, when the second word line WL2 is activated, the second bit line BLB coupled to the cell transistor CT2 to be turned on becomes a target bit line from which an output data is outputted, and the first bit line BLT becomes a reference bit line.

The sense amplifying circuit 150 may include a first precharge circuit 152, a second precharge circuit 154, a driving circuit 156, and a bit line sense amplifier (BLSA) 158.

The first precharge circuit 152 may supply a precharge voltage VBLP to a pull-up voltage line RTO and a pull-down voltage line SB, in response to an equalizing signal BLEQ. The second precharge circuit 154 may supply the precharge voltage VBLP to the first bit line BLT and the second bit line BLB, in response to an equalizing signal BLEQ. The precharge voltage VBLP may have an intermediate voltage level between a ground voltage VSS and a core voltage VCORE. The core voltage VCORE may have a voltage level lower than a supply voltage VDD. The first precharge circuit 152 may include first to third NMOS transistors MN1 to MN3, and the second precharge circuit 154 may include fourth to sixth NMOS transistors MN4 to MN6.

The driving circuit 156 may drive the pull-up voltage line RTO and the pull-down voltage line SB by supplying operating voltages to the pull-up voltage line RTO and the pull-down voltage line SB. The driving circuit 156 may include a pull-up driver MN7 and a pull-down driver MN8. The pull-up driver MN7 may provide the core voltage VCORE to the pull-up voltage line RTO in response to a pull-up control signal SAP. The pull-down driver MN8 may provide the ground voltage VSS to the pull-down voltage line SB in response to a pull-down control signal SAN. Each of the pull-up driver MN7 and the pull-down driver MN8 may be implemented with an NMOS transistor. According to an embodiment, the driving circuit 156 may support an over-driving scheme to provide the supply voltage VDD to the pull-up voltage line RTO in response to a first pull-up control signal SAP1, and provide the core voltage VCORE to the pull-up voltage line RTO in response to a second pull-up control signal SAP2.

The BLSA 158 may be coupled between the pull-up voltage line RTO and the pull-down voltage line SB, and sense a change in a voltage between the first bit line BLT and the second bit line BLB.

The operation of the sense amplifying circuit 150 with the above configuration is as follows. First, when the equalizing signal BLEQ is enable during a precharge operation, the first bit line BLT and the second bit line BLB connected to the first memory cell MC1 and the second memory cell MC2 are precharged to the precharge voltage VBLP. After the precharge operation, for example, when the first word line WL1 is activated, the cell transistor CT1 in the first memory cell MC1 may be turned on, resulting in a charge sharing operation in which the charge of the cell capacitor CP1 in the first memory cell MC1 flows into the first bit line BLT. By the charge sharing operation, the voltage at the first bit line BLT may be decreased or increased by the amount of voltage change from the precharge voltage VBLP. After the charge sharing operation, a pull-up voltage (i.e., the core voltage VCORE) is supplied to the pull-up voltage line RTO, and a pull-down voltage (i.e., the ground voltage VSS) is supplied to the pull-down voltage line SB. The BLSA 158 may sense the potential difference of the first bit line BLT and the second bit line BLB and amplify the potential difference.

Ideally, even though a slight voltage difference is present between the first bit line BLT and the second bit line BLB, the BLSA 158 should accurately sense and amplify the voltage difference. In reality, however, the BLSA 158 may not accurately sense and amplify a slight voltage difference. The minimum value of the voltage difference between the first bit line BLT and the second bit line BLB that the BLSA 158 accurately senses is referred to as an offset voltage. When the voltage difference between the first bit line BLT and the second bit line BLB is less than the offset voltage, the BLSA 158 may not perform an accurate sensing/amplification operation. A factor causing the voltage difference to be less than the offset voltage may include a mismatch between transistors included in the BLSA 158. NMOS transistors and PMOS transistors in charge of the sensing and amplification need to be manufactured to have the same characteristics. In reality, however, the mismatch may always be present due to a concern that the layout of the transistors is not symmetrically drawn with precision, a concern that patterns for forming the transistors are not identically formed even though the layout was symmetrically drawn, and/or a concern that contacts among the transistors are not identically defined.

Thus, in accordance with the embodiment, the BLSA 158 may sequentially perform a precharge operation, an offset cancellation operation, a charge sharing operation, and an amplification operation. That is, the BLSA 158 may sense and amplify a voltage difference between the first bit line BLT and the second bit line BLB, after performing the offset cancellation operation according to the sensing control signal CTRL. The BLSA 158 may maximize the voltage difference between the first bit line BLT and the second bit line BLB by pre-biasing a voltage level of a reference bit line (e.g., the second bit line BLB) depending on an output data (i.e., a voltage level of the first bit line BLT) during the charge sharing operation. Accordingly, the voltage difference between the first bit line BLT and the second bit line BLB may be widened and the sensing margin can be improved.

Hereinafter, referring to the drawings, the composition and operation of the BLSA 158 will be described specifically through various embodiments.

Figure 3:
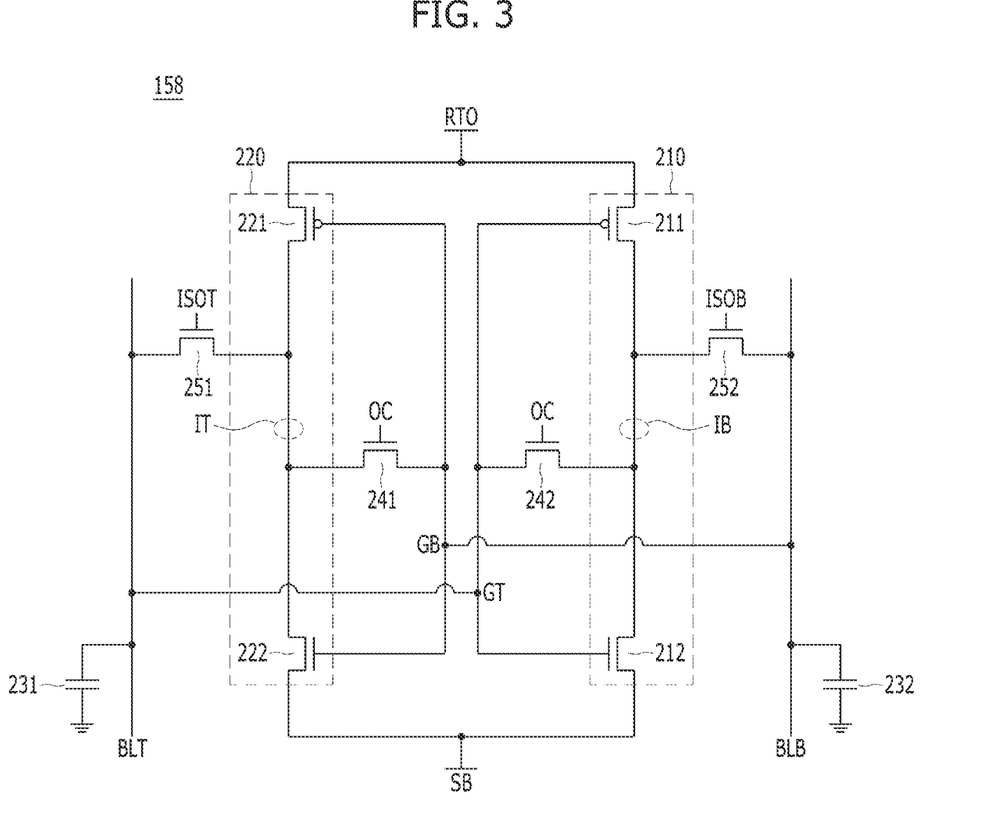
FIG. 3 is a circuit diagram illustrating a bit line sense amplifier in accordance with a first embodiment of the present invention.

FIG. 3 is a circuit diagram illustrating a bit line sense amplifier (BLSA) 158 in accordance with a first embodiment of the present invention.

Referring to FIG. 3, the BLSA 158 may include a first inverter 210, a second inverter 220, a first offset cancellation switch 241, a 20 second offset cancellation switch 242, a first isolation switch 251, and a second isolation switch 252.

The first inverter 210 may have an input terminal coupled to a first bit line BLT through a first sensing node GT, and an output terminal coupled to a second inner bit line IB. The first inverter 210 may include a PMOS transistor 211 and an NMOS transistor 212 coupled in series between a pull-up voltage line RTO and a pull-down voltage line SB. The second inverter 220 may have an input terminal coupled to a second bit line BLB through a second sensing node GB, and an output terminal coupled to a first inner bit line IT. The second inverter 220 may include a PMOS transistor 221 and an NMOS transistor 222 coupled in series between the pull-up voltage line RTO and the pull-down voltage line SB.

The first offset cancellation switch 241 may electrically couple the first inner bit line IT to the second sensing node GB and therefore to the second bit line BLB in response to an offset cancel signal OC. The second offset cancellation switch 242 may electrically couple the second inner bit line IB to the first sensing node GT and therefore to the first bit line BLT in response to the offset cancel signal OC. Each of the first and second offset cancellation switches 241 and 242 may be implemented with an NMOS transistor.

The first isolation switch 251 may electrically couple the first inner bit line IT to the first bit line BLT in response to a first isolation signal ISOT. The second isolation switch 252 may electrically couple the second inner bit line IB to the second bit line BLB in response to a second isolation signal ISOB. Each of the first and second isolation switches 251 and 252 may be implemented with an NMOS transistor. The first isolation signal ISOT and the second isolation signal ISOB may be sequentially turned on during an amplification operation.

Furthermore, a first capacitor 231 may be coupled to the first bit line BLT, and a second capacitor 232 may be coupled to the second bit line BLB. The first capacitor 231 and the second capacitor 232 may be parasitic capacitors of the first bit line BLT and the second bit line BLB, respectively. The first capacitor 231 and the second capacitor 232 may be configured to respectively store offsets of the first inverter 210 and the second inverter 220 during the offset cancellation operation. Since the offsets of the first inverter 210 and the second inverter 220 are respectively stored in the first capacitor 231 and the second capacitor 232, the offsets may be stored accurately even if the lengths of the first bit line BLT and the second bit line BLB are different or the loadings thereof are different.

For reference, in the first embodiment, the sensing control signal CTRL of FIGS. 1 and 2 may include the offset cancel signal OC, the first isolation signal ISOT, and the second isolation signal ISOB of FIG. 3. Depending on embodiment, the second precharge circuit 154 of FIG. 2 may apply the precharge voltage VBLP to the first inner bit line IT and the second inner bit line IB, in response to the equalizing signal BLEQ.

Hereinafter, referring to FIG. 1 to FIG. 5B, a sensing operation of the BLSA 158 in accordance with the first embodiment of the present invention will be described.

Figure 4:
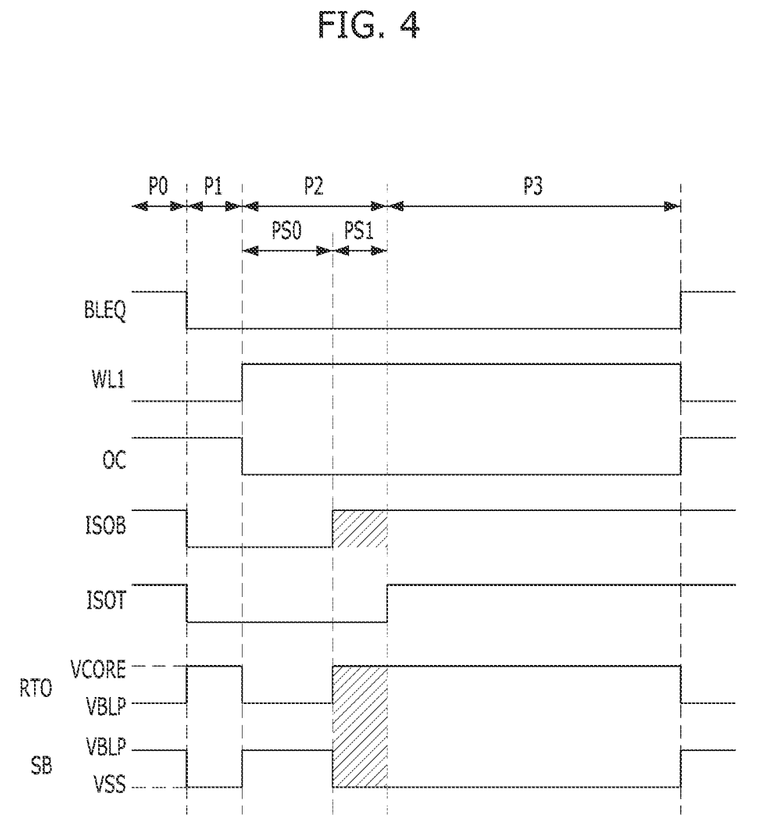
FIG. 4 is a timing diagram for describing an operation of the bit line sense amplifier of FIG. 3 in accordance with an embodiment of the present invention.
Figure 5A:
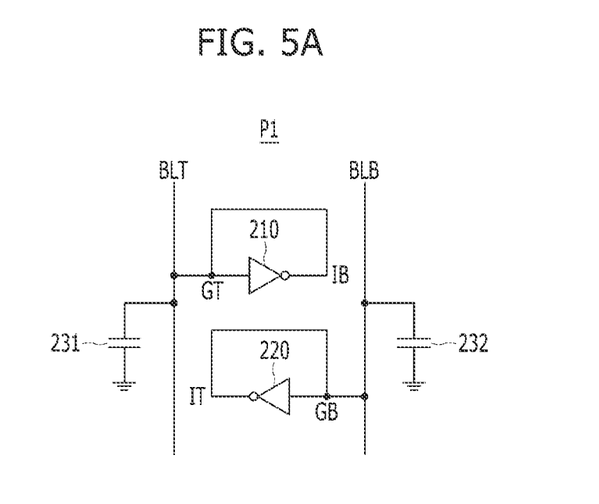
FIGS. 5A and 5B are circuit diagrams illustrating a connection status of the bit line sense amplifier during each operation of FIG. 4 in accordance with an embodiment of the present invention.
Figure 5B:
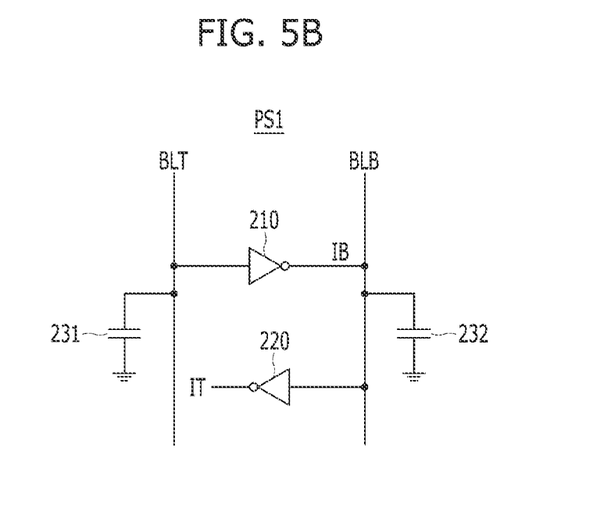

FIG. 4 is a timing diagram for describing an operation of the BLSA 158 of FIG. 3. FIGS. 5A and 5B are circuit diagrams illustrating a connection status of the BLSA 158 during an offset cancellation operation P1 and a pre-biasing operation PS1 of FIG. 4.

Referring to FIG. 4, the BLSA 158 may sequentially perform a precharge operation P0, the offset cancellation operation P1, a charge sharing operation P2, and an amplification operation P3. The charge sharing operation P2 may include a main charge sharing operation PS0 and the pre-biasing operation PS1, which are sequentially performed.

During the precharge operation P0, the equalizing signal BLEQ, the offset cancel signal OC, the first isolation signal ISOT, and the second isolation signal ISOB are enabled to a logic high level. In response to the equalizing signal BLEQ, the first to sixth NMOS transistors MN1 to MN6 of the first and second precharge circuits 152 and 154 are turned on. As a result, the precharge voltage VBLP may be applied to the pull-up voltage line RTO and the pull-down voltage line SB, and applied to the first bit line BLT and the second bit line BLB. Further, the first and second isolation switches 251 and 252 are turned on in response to the first isolation signal ISOT and the second isolation signal ISOB, and the first and second offset cancellation switches 241 and 242 are turned on in response to the offset cancel signal OC. As a result, during the precharge operation P0, the precharge voltage VBLP may be applied to all of the first inner bit line IT, the second inner bit line IB, the first bit line BLT, the second bit line BLB, the first sensing node GT, and the second sensing node GB so that they are precharged to the same voltage level as the precharge voltage VBLP. At this time, since the pull-up voltage line RTO and the pull-down voltage line SB may have the same voltage level, the first inverter 210 and the second inverter 220 may be deactivated.

During the offset cancellation operation P1, the equalizing signal BLEQ, the first isolation signal ISOT, and the second isolation signal ISOB are disabled to a logic low level, in a state that the offset cancel signal OC is enabled. At this time, the pull-up control signal SAP and the pull-down control signal SAN are enabled so that the core voltage VCORE may be supplied to the pull-up voltage line RTO and the ground voltage VSS may be supplied to the pull-down voltage line SB, thereby activating the first inverter 210 and the second inverter 220. In response to the offset cancel signal OC, the first offset cancellation switch 241 and the second offset cancellation switch 242 are turned on. Accordingly, as shown in FIG. 5A, the input terminal of the first inverter 210 is coupled to the output terminal thereof, and the input terminal of the second inverter 220 is coupled to the output terminal thereof. Since the input terminal and the output terminal of the first inverter 210 are coupled to the first capacitor 231, the PMOS transistor 211 and the NMOS transistor 212 are in a diode-connected status. As a result, a type of equilibrium state into which the offsets of the PMOS transistor 211 and the NMOS transistor 212 within the first inverter 210 are reflected may be stored in the first capacitor 231. Furthermore, since the input terminal and the output terminal of the second inverter 220 are coupled to the second capacitor 232, the PMOS transistor 221 and the NMOS transistor 222 are in a diode-connected status. As a result, a type of equilibrium state into which the offsets of the PMOS transistor 221 and the NMOS transistor 222 within the second inverter 220 are reflected may be stored in the second capacitor 232.

During the main charge sharing operation PS0 of the charge sharing operation P2, the pull-up control signal SAP, the pull-down control signal SAN, the equalizing signal BLEQ, the offset cancel signal OC, the first isolation signal ISOT, and the second isolation signal ISOB are disabled to a logic low level and the first word line WL1 is activated. Thus, the BLSA 158 may operate to isolate the first bit line BLT from the second bit line BLB, and the driving circuit 156 may stop supplying the operating voltage. During the main charge sharing operation PS0, the cell transistor CT1 coupled to the first word line WL1 is turned on, and thus, charges stored in the cell capacitor CP1 of the first memory cell MC1 may flow into the first bit line BLT through the channel of the cell transistor CT. By such a charge sharing operation PS0, a voltage level (VBLP+ΔV) of the first bit line BLT may become slightly higher or lower than a voltage level of the second bit line BLB that has the voltage level of the precharge voltage VBLP, according to a logic value of data stored in the first memory cell MC1.

In accordance with the first embodiment, during the pre-biasing operation PS1 prior to the amplification operation P3, the second isolation signal ISOB is enabled first in a state that the first word line WL1 is activated. At this time, the pull-up control signal SAP and the pull-down control signal SAN are enabled so that the core voltage VCORE may be supplied to the pull-up voltage line RTO and the ground voltage VSS may be supplied to the pull-down voltage line SB, thereby activating the first inverter 210 and the second inverter 220. In response to the second isolation signal ISOB, the second isolation switch 252 is turned on. Accordingly, as shown in FIG. 5B, the first bit line BLT may be coupled to the second bit line BLB through the second inner bit line IB, and thus, the first inverter 210 may invert the voltage level (VBLP+ΔV) of the first bit line BLT to provide the inverted voltage level to the second bit line BLB. That is, during the pre-biasing operation PS1 of the charge sharing operation P2, the BLSA 158 may bias the voltage level of the second bit line BLB depending on the voltage level of the first bit line BLT, and the driving circuit 156 may provide the operating voltage to the pull-up voltage line RTO and the pull-down voltage line SB.

During the amplification operation P3, the first isolation signal ISOT is enabled. In response to the first isolation signal ISOT, the first isolation switch 251 is turned on so that the second bit line BLB may be coupled to the first bit line BLT through the first inner bit line IT. Thus, the first inverter 210 and the second inverter 220 amplify a voltage difference between the first bit line BLT and the second bit line BLB. Since the voltage difference therebetween is amplified while the voltages into which the offsets of the first inverter 210 and the second inverter 220 are respectively reflected are stored in the capacitor 231 and the second capacitor 232, the BLSA 158 may perform the amplification operation P3 with high precision. That is, the offset voltage for guaranteeing the precise amplification operation of the BLSA 158 may be reduced.

As described above, in accordance with the first embodiment, by enabling the second isolation signal ISOB prior to the first isolation signal ISOT, the first inverter 210 may first operate to provide the inverted level of the voltage level (VBLP+ΔV) of the first bit line BLT to the second bit line BLB during the pre-biasing operation PS1 of the charge sharing operation P2. That is, a voltage level of a reference bit line (e.g., the second bit line BLB) may be pre-biased depending on an output data (i.e., the voltage level of the first bit line BLT). Through this, the voltage difference between the first bit line BLT and the second bit line BLB may be widened and the sensing margin can be improved.

Figure 6:
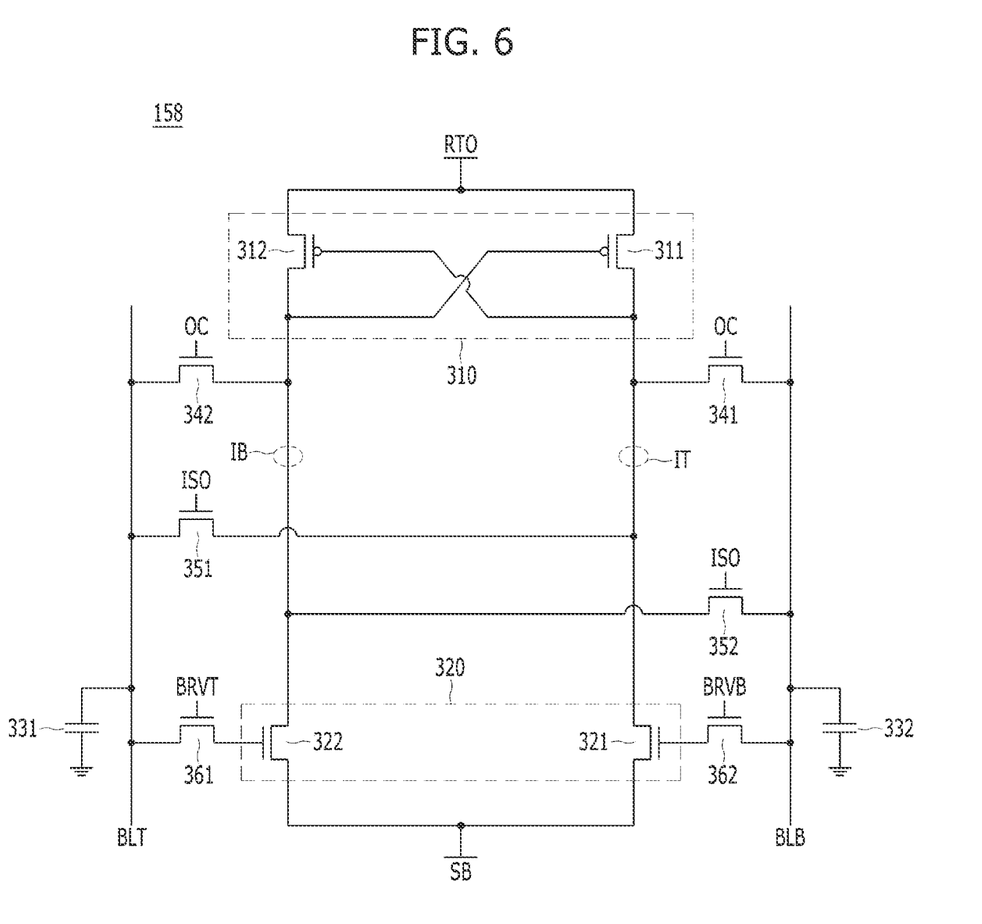
FIG. 6 is a circuit diagram illustrating a bit line sense amplifier in accordance with a second embodiment of the present invention.

FIG. 6 is a circuit diagram illustrating a bit line sense amplifier (BLSA) 158 in accordance with a second embodiment of the present invention.

Referring to FIG. 6, the BLSA 158 may include a pull-up circuit 310, a pull-down circuit 320, a first offset cancellation switch 341, a second offset cancellation switch 342, a first isolation switch 351, a second isolation switch 352, a first pre-biasing switch 361, and a second pre-biasing switch 362.

The pull-up circuit 310 may include a first PMOS transistor 311 and a second PMOS transistor 312. The first PMOS transistor 311 may be coupled between a pull-up voltage line RTO and a first inner bit line IT, and the second PMOS transistor 312 may be coupled between the pull-up voltage line RTO and a second inner bit line IB. Each of the first and second PMOS transistors may be disposed in a cross-coupled structure to which a drain and a gate are coupled.

The pull-down circuit 320 may include a first NMOS transistor 321 and a second PMOS transistor 322. The first NMOS transistor 321 may be coupled between a pull-down voltage line SB and the first inner bit line IT. The first NMOS transistor 321 may have a gate coupled to a second bit line BLB through the second pre-biasing switch 362. The second NMOS transistor 322 may be coupled between the pull-down voltage line SB and the second inner bit line IB. The second NMOS transistor 322 may have a gate coupled to a first bit line BLT through the first pre-biasing switch 361. The pull-up circuit 310 and the pull-down circuit 320 may form a latch structure to sense and amplify a voltage level between the first inner bit line IT and second inner bit line IB.

The first offset cancellation switch 341 may electrically couple the first inner bit line IT to the second bit line BLB in response to an offset cancel signal OC. The second offset cancellation switch 342 may electrically couple the second inner bit line IB to the first bit line BLT in response to the offset cancel signal OC. Each of the first and second offset cancellation switches 341 and 342 may be implemented with an NMOS transistor.

The first isolation switch 351 may electrically couple the first inner bit line IT to the first bit line BLT in response to an isolation signal ISO. The second isolation switch 352 may electrically couple the second inner bit line IB to the second bit line BLB in response to the isolation signal ISO. Each of the first and second isolation switches 351 and 352 may be implemented with an NMOS transistor.

The first pre-biasing switch 361 may electrically couple the gate of the second NMOS transistor 322 to the first bit line BLT in response to a first biasing signal BRVT. The second pre-biasing switch 362 may electrically couple the gate of the first NMOS transistor 321 to the second bit line BLB in response to a second biasing signal BRVB. Each of the first and second pre-biasing switches 361 and 362 may be implemented with an NMOS transistor.

In the second embodiment, when the first and second isolation switches 351 and 352 and the first and second pre-biasing switches 361 and 362 are turned on, the first PMOS transistor 311 and the first NMOS transistor 321 may form a first inverter, and the second PMOS transistor 312 and the second NMOS transistor 322 may form a second inverter.

Furthermore, a first capacitor 331 may be coupled to the first bit line BLT, and a second capacitor 332 may be coupled to the second bit line BLB. The first capacitor 331 and the second capacitor 332 may be parasitic capacitors configured to respectively store offsets of the first and second PMOS transistors 311 and 312 and the first and second NMOS transistors 321 and 322 during the offset cancellation operation. Since the offsets of the first PMOS transistor 311 and the first NMOS transistor 321 forming the first inverter and the second PMOS transistor 312 and the second NMOS transistor 322 forming the second inverter are respectively stored in the first capacitor 331 and the second capacitor 332, the offsets may be stored accurately even if the lengths of the first bit line BLT and the second bit line BLB are different or the loadings thereof are different.

For reference, in the second embodiment, the sensing control signal CTRL of FIGS. 1 and 2 may include the offset cancel signal OC, the isolation signal ISO, the first biasing signal BRVT and the second biasing signal BRVB of FIG. 6. Depending on embodiment, the second precharge circuit 154 of FIG. 2 may apply the precharge voltage VBLP to the first inner bit line IT and the second inner bit line IB, in response to the equalizing signal BLEQ.

Hereinafter, referring to FIGS. 1, 2, and 6 to 8C, a sensing operation of the BLSA 158 in accordance with the second embodiment will be described.

Figure 7:
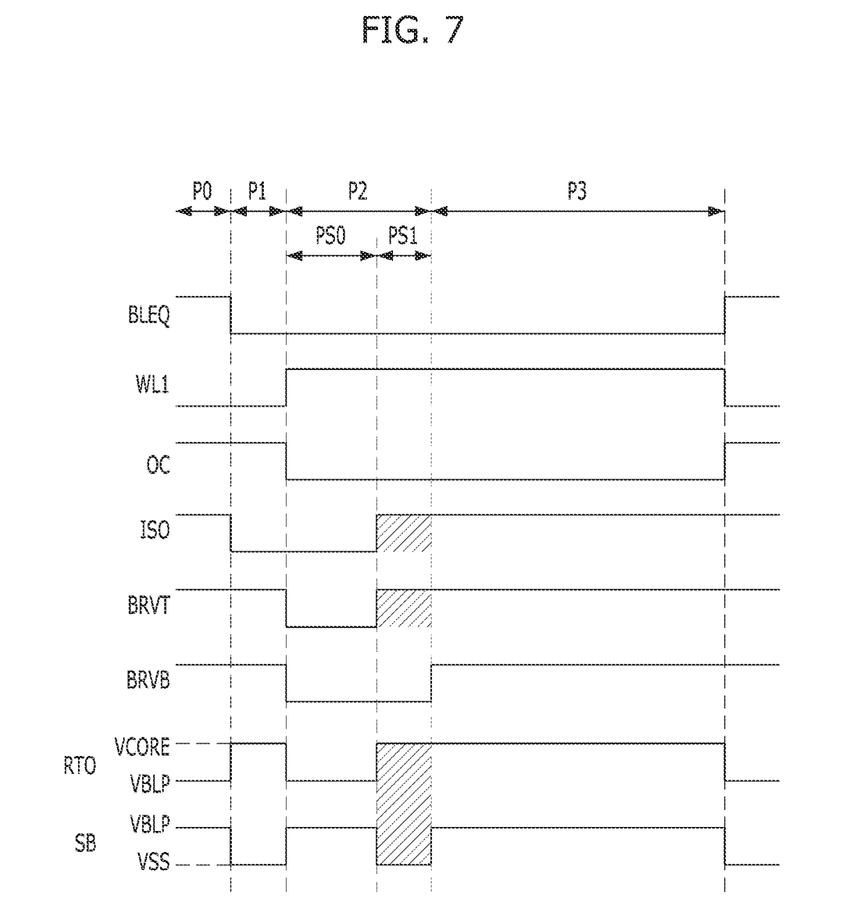
FIG. 7 is a timing diagram for describing an operation of the bit line sense amplifier of FIG. 6 in accordance with an embodiment of the present invention.
Figure 8A:
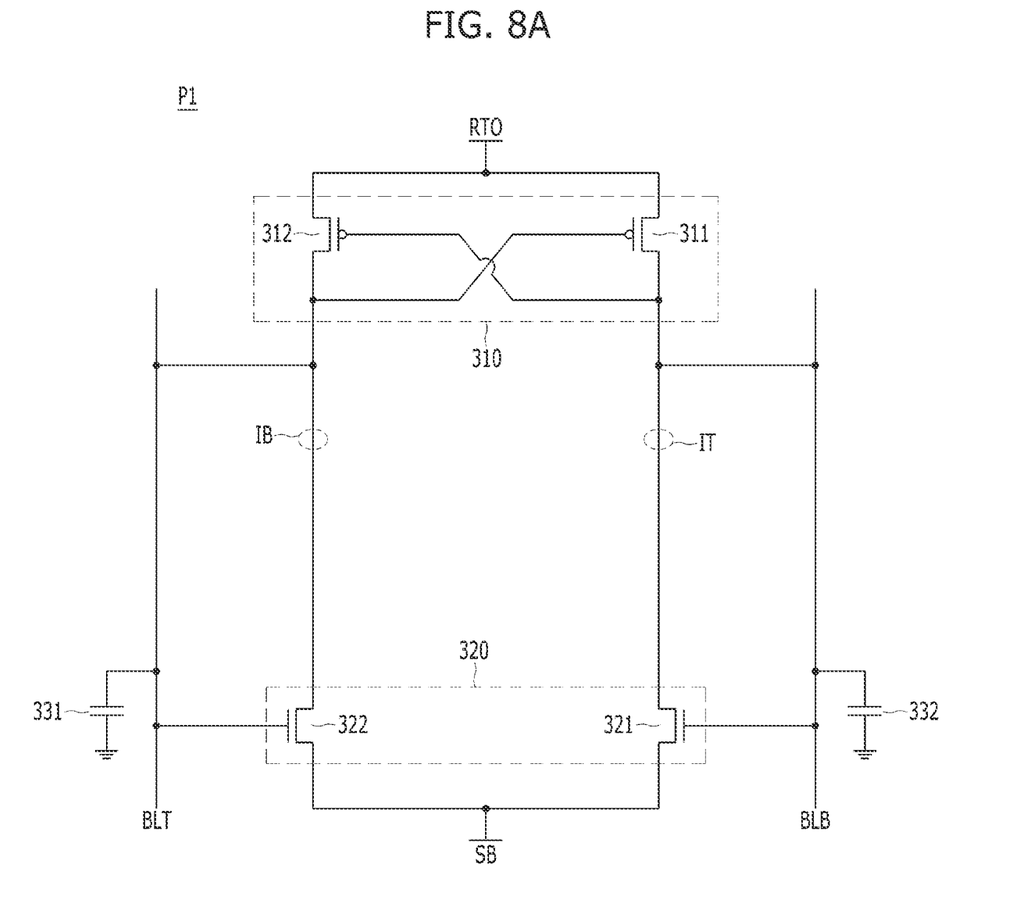
FIGS. 8A to 8C are circuit diagrams illustrating a connection status of the bit line sense amplifier during each operation of FIG. 7 in accordance with an embodiment of the present invention.
Figure 8B:
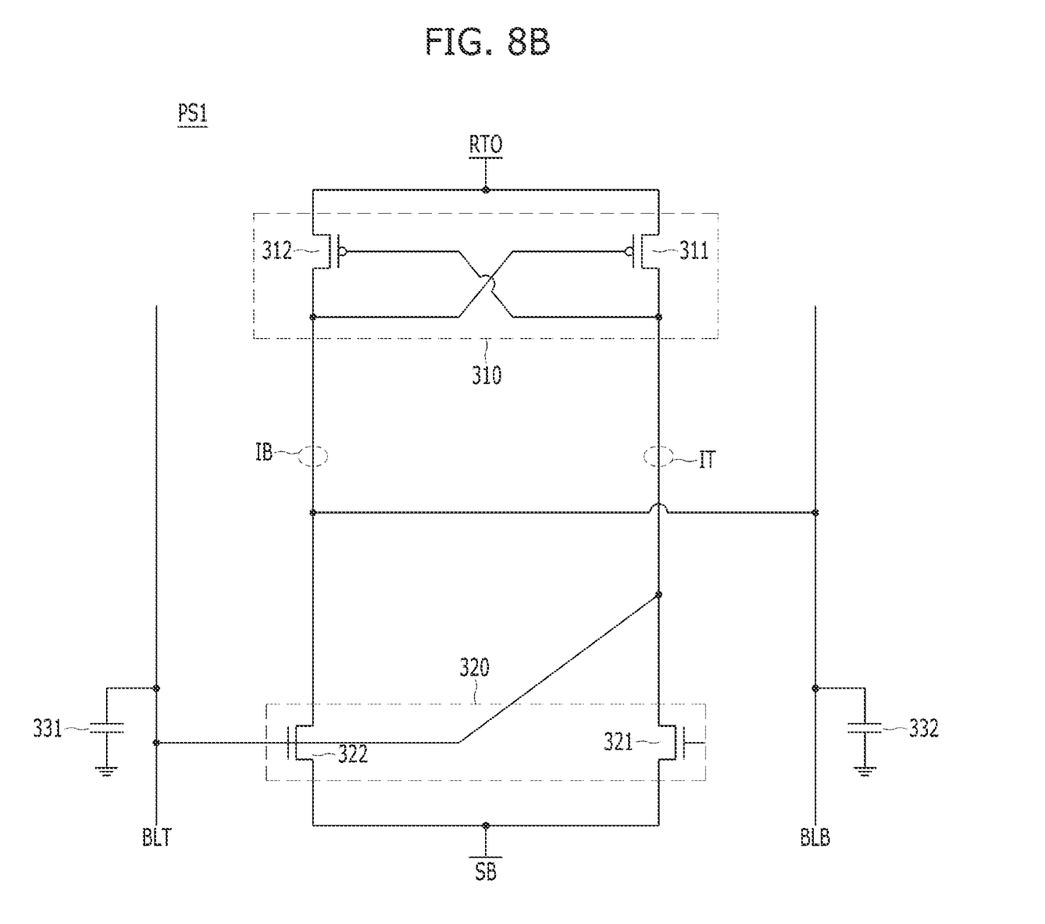
Figure 8C:
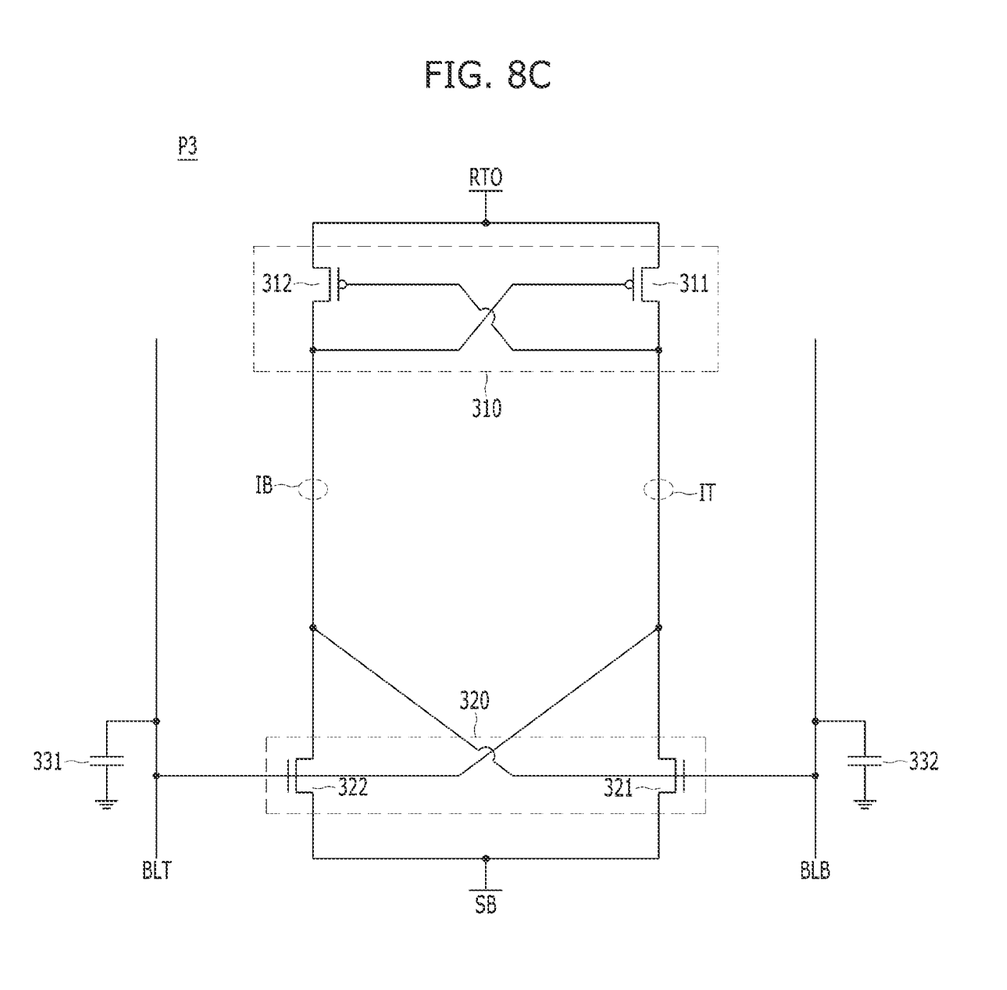

FIG. 7 is a timing diagram for describing an operation of the BLSA 158 of FIG. 6 in accordance with an embodiment of the present invention. FIGS. 8A to 8C are circuit diagrams illustrating a connection status of the BLSA 158 during an offset cancellation operation P1, a pre-biasing operation PS1, and an amplification operation P3 of FIG. 7 in accordance with an embodiment of the present invention.

Referring to FIG. 7, the BLSA 158 may sequentially perform a precharge operation P0, the offset cancellation operation P1, a charge sharing operation P2, and the amplification operation P3. The charge sharing operation P2 may include a main charge sharing operation PS0 and the pre-biasing operation PS1, which are sequentially performed.

During the precharge operation P0, the equalizing signal BLEQ, the offset cancel signal OC, the isolation signal ISO, the first biasing signal BRVT and the second biasing signal BRVB are enabled to a logic high level. In response to the equalizing signal BLEQ, the first to sixth NMOS transistors MN1 to MN6 of the first and second precharge circuits 152 and 154 are turned on. As a result, the precharge voltage VBLP may be applied to the pull-up voltage line RTO and the pull-down voltage line SB and applied to the first bit line BLT and the second bit line BLB. Further, the first and second isolation switches 351 and 352 are turned on in response to the isolation signal ISO, and the first and second offset cancellation switches 341 and 342 are turned on in response to the offset cancel signal OC. As a result, during the precharge operation P0, the precharge voltage VBLP may be applied to all of the first inner bit line IT, the second inner bit line IB, the first bit line BLT, and the second bit line BLB so that they are precharged to the same voltage level as the precharge voltage VBLP.

During the offset cancellation operation P1, the equalizing signal BLEQ and the isolation signal ISO are disabled to a logic low level in a state that the offset cancel signal OC, the first biasing signal BRVT, and the second biasing signal BRVB are enabled. The core voltage VCORE may be supplied to the pull-up voltage line RTO, and the ground voltage VSS may be supplied to the pull-down voltage line SB. In response to the offset cancel signal OC, the first offset cancellation switch 341 and the second offset cancellation switch 342 are turned on, and thus, the first bit line BLT is coupled to the second inner bit line IB, and the second bit line BLB is coupled to the first inner bit line IT. Further, in response to the first biasing signal BRVT and the second biasing signal BRVB, the first pre-biasing switch 361 and the second pre-biasing switch 362 are turned on. Thus, the gate of the second NMOS transistor 322 is coupled to the first bit line BLT, and the gate of the first NMOS transistor 321 is coupled to the second bit line BLB. As a result, as shown in FIG. 8A, the first NMOS transistor 321 and the second PMOS transistor 322 included in the pull-down circuit 320 are in a diode-connected status.

At this time, due to process, voltage, and temperature (PVT) variation, when a threshold voltage (Vth) of the first NMOS transistor 321 is different from a threshold voltage (Vth) of the second NMOS transistor 322, a voltage level of the first bit line BLT becomes increased or decreased by an offset voltage from the precharge voltage VBLP. For example, when the threshold voltage (Vth) of the first NMOS transistor 321 is higher than the threshold voltage (Vth) of the second NMOS transistor 322, the current flowing through the first NMOS transistor 321 is less than the current flowing through the second NMOS transistor 322. Further, the current flowing through the first PMOS transistor 311 is greater than the current flowing through the second PMOS transistor 312. Accordingly, the voltage level of the first bit line BLT becomes increased by a certain level corresponding to the offset voltage when compared with the voltage level of the second bit line BLB. Offsets of the first bit line BLT and the second bit line BLB may be respectively stored in the first capacitor 331 and the second capacitor 332.

During the main charge sharing operation PS0 of the charge sharing operation P2, the equalizing signal BLEQ, the isolation signal ISO, the offset cancel signal OC, the first biasing signal BRVT, and the second biasing signal BRVB are disabled to a logic low level, and the first word line WL1 is activated. Thus, the BLSA 158 may operate to isolate the first bit line BLT from the second bit line BLB, and the driving circuit 156 may stop supplying the operating voltage. During the main charge sharing operation PS0, the cell transistor CT1 coupled to the first word line WL1 is turned on, and thus, charges stored in the cell capacitor CP1 of the first memory cell MC1 may flow into the first bit line BLT through the channel of the cell transistor CT1. By such a charge sharing operation, a voltage level (VBLP+ΔV) of the first bit line BLT may become slightly higher or lower than a voltage level of the second bit line BLB that has the voltage level of the precharge voltage VBLP, according to a logic value of data stored in the first memory cell MC1.

In accordance with the second embodiment, during the pre-biasing operation PS1 prior to the amplification operation P3, the isolation signal ISO and the first biasing signal BRVT are enabled first in a state that the first word line WL1 is activated. At this time, the core voltage VCORE may be supplied to the pull-up voltage line RTO and the ground voltage VSS may be supplied to the pull-down voltage line SB. In response to the isolation signal ISO, the first isolation switch 351 and the second isolation switch 352 are turned on. In response to the first biasing signal BRVT, the first pre-biasing switch 361 is turned on. As shown in FIG. 8B, the first bit line BLT may be coupled to the first inner bit line IT through the gate of the second NMOS transistor 322. Accordingly, the second inverter including the second PMOS transistor 312 and the second NMOS transistor 322 may invert the voltage level (VBLP+ΔV) of the first bit line BLT to provide the inverted voltage level to the second bit line BLB. That is, during the pre-biasing operation PS1 of the charge sharing operation P2, the BLSA 158 may bias the voltage level of the second bit line BLB depending on the voltage level of the first bit line BLT, and the driving circuit 156 may provide the operating voltage to the pull-up voltage line RTO and the pull-down voltage line SB.

During the amplification operation P3, the second biasing signal BRVT is enabled. In response to the second biasing signal BRVT, the second pre-biasing switch 362 is turned on. As shown in FIG. 8C, the second bit line BLB may be coupled to the second inner bit line IB through the gate of the first NMOS transistor 321. Thus, the first inverter including the first PMOS transistor 311 and the first NMOS transistor 321, and the second inverter including the second PMOS transistor 312 and the second NMOS transistor 322 amplify a voltage difference between the first bit line BLT and the second bit line BLB. Since the voltage difference therebetween is amplified while the voltages into which the offsets of the first inverter and the second inverter are respectively reflected are stored in the capacitor 331 and the second capacitor 332, the BLSA 158 may perform the amplification operation P3 with high precision. That is, the offset voltage for guaranteeing the precise amplification operation of the BLSA 158 may be reduced.

As described above, in accordance with the second embodiment, the first pre-biasing switch 361 and the second pre-biasing switch 362 are additionally disposed to respectively couple input terminals of the pull-down circuit 320 to the first bit line BLT and the second bit line BLB. By enabling the first basing signal BRVT to turn on the first pre-biasing switch 361, prior to the second basing signal BRVB, the second inverter including the second PMOS transistor 312 and the second NMOS transistor 322 may first operate to provide the inverted level of the voltage level (VBLP+ΔV) of the first bit line BLT to the second bit line BLB during the pre-biasing operation PS1 of the charge sharing operation P2. That is, a voltage level of a reference bit line (e.g., the second bit line BLB) may be pre-biased depending on an output data (i.e., the voltage level of the first bit line BLT). Through this, the voltage difference between the first bit line BLT and the second bit line BLB may be widened and the sensing margin can be improved.

As set forth above, according to the embodiments, the sense amplifying circuit may compensate for an offset by an offset cancellation operation and maximize a voltage difference between a bit line and a reference bit line by pre-biasing a voltage level of the reference bit line depending on a data value of the bit line. Thus, by maximizing the potential difference in the bit line pair, the effective sensing margin can be improved, which has the effect of improving the performance of the memory device.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure.

For example, for the logic gates and transistors provided as examples in the above-described embodiments, different positions and types may be implemented depending on the polarity of the input signal.

From the foregoing it will be appreciated that, although specific embodiments of the invention have been described herein for purposes of illustration, various modifications may be made without deviating from the spirit and scope of the invention. Accordingly, the invention should not be limited except according to the following appended claims.

What is claimed is:

1. A semiconductor memory device, comprising:
   a bit line sense amplifier coupled between a pull-up voltage line and a pull-down voltage line, and suitable for sensing a voltage difference between first and second bit lines by sequentially performing a precharge operation, an offset cancellation operation, a charge sharing operation, and an amplification operation, wherein the bit line sense amplifier pre-biases a voltage level of the second bit line depending on a voltage level of the first bit line during the charge sharing operation; and
   a driving circuit suitable for supplying operating voltages to the pull-up voltage line and the pull-down voltage line during the offset cancellation operation, the charge sharing operation, and the amplification operation,
   wherein the charge sharing operation includes a main charge sharing operation and a pre-biasing operation, which are sequentially performed, and
   wherein, during the pre-biasing operation, the bit line sense amplifier biases the voltage level of the second bit line depending on the voltage level of the first bit line and the driving circuit provides the operating voltage to the pull-up voltage line and the pull-down voltage line.

2. The semiconductor memory device of claim 1, wherein, during the main charge sharing operation, the bit line sense amplifier operates to isolate the first bit line from the second bit line, and the driving circuit stops supplying the operating voltage to the pull-up voltage line and the pull-down voltage line.

3. The semiconductor memory device of claim 1, further comprising a precharge circuit suitable for supplying a precharge voltage to the pull-up voltage line, the pull-down voltage line, and the first and second bit lines during the precharge operation.

4. A sense amplifying circuit, comprising:
   a first inverter having an input terminal coupled to a first bit line and an output terminal coupled to a second inner bit line;
   a second inverter having an input terminal coupled to a second bit line and an output terminal coupled to a first inner bit line;
   a first offset cancellation switch suitable for electrically coupling the first inner bit line to the second bit line during an offset cancellation operation;
   a second offset cancellation switch suitable for electrically coupling the second inner bit line to the first bit line during the offset cancellation operation;
   a first isolation switch suitable for electrically coupling the first inner bit line to the first bit line during an amplification operation; and
   a second isolation switch suitable for electrically coupling the second inner bit line to the second bit line during a charge sharing operation and the amplification operation, wherein the charge sharing operation includes a main charge sharing operation and a pre-biasing operation, and the first isolation switch is turned off and the second isolation switch is turned on, during the pre-biasing operation.

5. The sense amplifying circuit of claim 4, wherein the sense amplifying circuit sequentially performs a precharge operation, the offset cancellation operation, the charge sharing operation, and the amplification operation.

6. The sense amplifying circuit of claim 5, wherein the first and second inner bit lines and the first and second bit lines are precharged to a same voltage level during the precharge operation.

7. The sense amplifying circuit of claim 5, wherein the first and second inverters are deactivated and the first and second offset cancellation switches and the first and second isolation switches are turned on, during the precharge operation.

8. The sense amplifying circuit of claim 4, wherein the first and second inverters are activated and the first and second offset cancellation switches are turned on and the first and second isolation switches are turned off, during the offset cancellation operation.

9. The sense amplifying circuit of claim 4,
wherein the first and second offset cancellation switches and the first and second isolation switches are turned off during the main charge sharing operation, and
wherein the first and second offset cancellation switches and the first isolation switch are turned off and the second isolation switch is turned on, during the pre-biasing operation.

10. The sense amplifying circuit of claim 4, wherein the first and second inverters are activated and the first and second offset cancellation switches are turned off and the first and second isolation switches are turned on, during the amplification operation.

11. A sense amplifying circuit, comprising:
a pull-up circuit including first and second pull-up transistors respectively coupled between a pull-up voltage line and first and second inner bit lines, the first and second pull-up transistors having a cross-coupled structure;
a pull-down circuit including first and second pull-down transistors respectively coupled between a pull-down voltage line and the first and second inner bit lines;
a first offset cancellation switch suitable for electrically coupling the first inner bit line to a second bit line during an offset cancellation operation;
a second offset cancellation switch suitable for electrically coupling the second inner bit line to a first bit line during the offset cancellation operation;
a first isolation switch suitable for electrically coupling the first inner bit line to the first bit line during an amplification operation;
a second isolation switch suitable for electrically coupling the second inner bit line to the second bit line during the amplification operation;
a first pre-biasing switch suitable for electrically coupling a gate of the second pull-down transistor to the first bit line during the offset cancellation operation, a charge sharing operation and the amplification operation; and
a second pre-biasing switch suitable for electrically coupling a gate of the first pull-down transistor to the second bit line during the offset cancellation operation and the amplification operation.

12. The sense amplifying circuit of claim 11, wherein the sense amplifying circuit sequentially performs a precharge operation, the offset cancellation operation, the charge sharing operation, and the amplification operation.

13. The sense amplifying circuit of claim 12, wherein the first and second inner bit lines and the first and second bit lines are precharged to a same voltage level during the precharge operation.

14. The sense amplifying circuit of claim 12, wherein the first and second offset cancellation switches, the first and second isolation switches, and the first and second pre-biasing switches are turned on during the precharge operation.

15. The sense amplifying circuit of claim 11, wherein the first and second offset cancellation switches and first and second pre-biasing switches are turned on and the first and second isolation switches are turned off, during the offset cancellation operation.

16. The sense amplifying circuit of claim 11,
wherein the charge sharing operation includes a main charge sharing operation and a pre-biasing operation,
wherein the first and second offset cancellation switches and the first and second isolation switches, and the first and second pre-biasing switches are turned off during the main charge sharing operation, and
wherein the first and second offset cancellation switches and the second pre-biasing switch are turned off and the first and second isolation switches and the first pre-biasing switch are turned on, during the pre-biasing operation.

17. The sense amplifying circuit of claim 11, wherein the first and second offset cancellation switches are turned off and the first and second isolation switches and the first and second pre-biasing switches are turned on, during the amplification operation.

18. An operating method of a semiconductor memory device, the operating method comprising performing:
a precharge operation of precharging target and reference bit lines to a precharge level;
a charge sharing operation of making the target bit line share a charge stored in a target memory cell for the target bit line to have a voltage level different from the reference bit line;
a pre-biasing operation of adjusting the voltage level of the reference bit line to an inverted voltage level of the target bit line; and
an amplification operation of amplifying a voltage difference between the target and reference bit lines.

* * * * *